United States Patent [19]

Minten et al.

[11] Patent Number: 4,619,741

[45] Date of Patent: Oct. 28, 1986

[54] PROCESS FOR PREPARING A NON-CONDUCTIVE SUBSTRATE FOR ELECTROPLATING

[75] Inventors: Karl L. Minten, Cannock, United Kingdom; Galina Pismennaya, Palisades Park, N.J.

[73] Assignee: Olin Hunt Specialty Products Inc., Palisades Park, N.J.

[21] Appl. No.: 802,892

[22] Filed: Nov. 29, 1985

Related U.S. Application Data

[63] Continuation-in-part of Ser. No. 721,964, Apr. 11, 1985, abandoned.

[51] Int. Cl.[4] .......................... C25D 5/02; C25D 5/54
[52] U.S. Cl. ......................................... 204/15; 204/20; 204/26
[58] Field of Search ..................... 204/15, 26, 38.4, 20

[56] References Cited

U.S. PATENT DOCUMENTS

| | | | |
|---|---|---|---|
| 409,096 | 8/1889 | Blank | 204/30 |
| 1,037,469 | 9/1912 | Goldberg | 204/30 |
| 1,352,331 | 9/1920 | Unno | 204/31 |
| 2,243,429 | 5/1941 | Laux | 204/30 |
| 2,947,064 | 8/1960 | Langton | 29/155.5 |
| 3,003,975 | 10/1961 | Louis | 252/503 |
| 3,014,818 | 12/1961 | Campbell | 179/51 |
| 3,099,608 | 7/1963 | Rodovsky et al. | 204/15 |
| 3,163,588 | 12/1964 | Shortt et al. | 204/16 |
| 3,249,559 | 5/1966 | Gallas | 252/510 |
| 3,696,054 | 10/1972 | Saunders | 252/511 |
| 3,799,802 | 3/1974 | Schneble, Jr. et al. | 29/625 |
| 3,910,852 | 10/1975 | Lederman et al. | 252/512 |
| 3,941,584 | 3/1976 | Tundermann et al. | 106/290 |
| 4,035,265 | 7/1977 | Saunders | 252/510 |
| 4,090,984 | 5/1978 | Lin et al. | 252/511 |
| 4,239,794 | 12/1980 | Allard | 428/219 |
| 4,305,847 | 12/1981 | Stoetzer et al. | 252/512 |
| 4,389,268 | 6/1983 | Oshima et al. | 156/150 |
| 4,478,882 | 10/1984 | Roberto | 427/97 |

*Primary Examiner*—T. M. Tufariello
*Attorney, Agent, or Firm*—William A. Simons; Thomas P. O'Day

[57] ABSTRACT

A process for electroplating a conductive metal layer to the surface of a non-conductive material which comprises:

(a) preparing a liquid dispersion of carbon black comprised of:
  (1) carbon black particles having an average particle diameter of less than about 3.0 microns in said dispersion;
  (2) an effective dispersing amount of a surfactant which is compatible with said carbon black; and
  (3) liquid dispersing medium, wherein the amount of carbon black is sufficient to coat substantially all of said non-conducting surfaces and is less than about 4% by weight of said liquid dispersion;
(b) applying said liquid disperison to the surface of the non-conducting material;
(c) separating substantially all of said liquid dispersing medium from said carbon black particles, whereby said particles are deposited on said non-conductive surface in a substantially continuous layer; and
(d) electroplating a substantially continuous conductive metal layer over the deposited carbon black layer and said non-conductive surface.

22 Claims, No Drawings

PROCESS FOR PREPARING A NON-CONDUCTIVE SUBSTRATE FOR ELECTROPLATING

CROSS-REFERENCES TO RELATED APPLICATIONS

This application is a continuation-in-part application of U.S. patent application Ser. No. 721,964 filed on Apr. 11, 1985 now abandoned and having Karl Minten as the named inventor.

BACKGROUND OF THE INVENTION

1. Field of the Invention

This invention relates to a process for preparing a non-conductive substrate for electroplating. In particular, this invention relates to a process for preparing the through hole walls of a printed wiring board (PWB) for electroplating. Further, this invention relates to a new liquid dispersion for preparing PWB through hole walls for electroplating. Still further, the present invention relates to the resulting printed wiring board prepared by the above-noted process.

2. Description of Related Art

For the past quarter century the printed wiring board industry has relied on the electroless copper deposition process to prepare through hole walls in printed wiring boards for electroplating. These plated through hole walls are necessary to achieve connections between two metal circuit patterns on each side of a printed wiring board or, in addition to this, between the inner layer circuit patterns of a multilayer board.

The electroless deposition of copper onto the through hole walls typically consists of precleaning a PWB and then processing according to the following flow diagram:

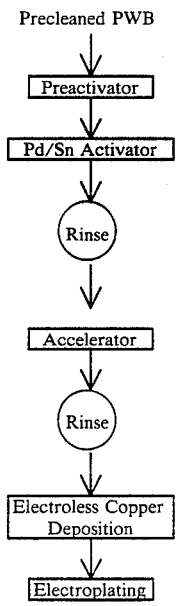

These processed boards may also be photoimaged before the electroplating process. Normally, the deposited copper layer on each through hole wall is about 1±0.2 mil thick.

Conventional electroless processes have several commercial disadvantages. They require a reactively long process time. The multiple treatment baths have complex chemistry which may require constant monitoring and individual ingredients which may require separate replenishment. The palladium/tin activator also may require expensive waste treatment. Furthermore, these electroless process baths may be very sensitive to contamination. Finally, the multiplicity of rinse baths may require large amounts of water.

Prior to the electroless method of plating through holes, graphite was employed to prepare the walls of the through holes for plating. For example, U.S. Pat. No. 3,099,608, which issued to Radovsky et al on July 30, 1963, teaches a process for preparing the through hole walls of printed circuit boards for electroplating by initially depositing in said through holes a thin electrically non-conductive film of palladium metal in at least a semi-colloidal form. The patent discloses that graphite had been used previously as a conductive layer for electroplating thereon. See column 1, lines 63–70 and column 4, line 72 to column 5, line 11. These patentees noted several defects with that graphite process including lack of control of the graphite application, poor deposit of the resultant electroplated metal, non-uniform through hole diameters, and low electrical resistance of the graphite.

U.S. Pat. No. 3,163,588, which issued to Shortt et al on Dec. 29, 1964, also mentions that graphite or its equivalents may be employed to render through hole walls of electric circuit boards conductive for later electroplating metals thereon. See column 3, line 45 to column 4, line 2.

Separately, graphite has been employed in numerous processes for preparing a non-conducting material for a metal coating or plating. For example, U.S. Pat. No. 409,096, which issued to Alois Blank on Aug. 13, 1889, teaches a process for applying copper to asbestos roofing material which comprises first applying powdered plumbago (graphite) in a volatile liquid such as varnish to the surface of the asbestos, then evaporating the volatile liquid to coat the asbestos fibers with fine particles of plumbago. The plumbago coated asbestos sheets are then immersed in a copper electroplating solution and electric current is applied to the coated asbestos sheet to form a thin film of copper thereon. The copper coated sheet is then immersed in a bath of molten metal such as tin, lead, or zinc, and is then removed from the molten bath to effect solidification of the molten metal. The resulting metal coated asbestos sheet is described as being relatively flexible, a non-conductor of heat and substantially fireproof.

U.S. Pat. No. 1,037,469, which issued to Goldberg on Sept. 3, 1912, and U.S. Pat. No. 1,352,331, which issued to Unno on Sept. 7, 1920, disclose processes for electroplating non-conducting materials by first coating the non-conducting material with wax, then coating the wax with a slurry of finely divided particles of graphite or other metal, followed by electroplating of the dust coated surface with copper or other metal. Neither of these processes are particularly suitable for use in coating the hole walls of circuit boards because the holes are normally extremely narrow in diameter and immersing in wax would tend to plug the hole and prevent coating the hole walls with an electroplating material.

U.S. Pat. No. 2,243,429, which issued to Laux on May 27, 1941, discloses a process for electroplating a non-conductive surface by "graphiting" a thin layer onto the non-conductive surface followed by applying a copper layer electrolytically and "finally a further electrolytic deposit of another metal" is placed thereon.

Separately, carbon black formulations have been employed as conductive coatings for non-conductive materials. For example, U.S. Pat. No. 4,035,265, which issued to Saunders on July 12, 1977, discloses conductive paint compositions containing both graphite and carbon black along with air-hardenable binder. These paints are suitable for application to the walls of a building for use as a heating element.

U.S. Pat. No. 4,090,984, which issued to Lin et al on May 23, 1978, teaches a semi-conductive coating for glass fibers comprising (a) a polyacrylate emulsion; (b) electrically conductive carbon black dispersion and (c) a thixotropic gelling agent. The conductive carbon black dispersions employed are those comprising electrically conductive carbon black dispersed in from about 3 to about 4 percent by weight of a suitable dispersing agent.

U.S. Pat. No. 4,239,794, which issued to Allard on Dec. 16, 1980, teaches dispersing a conductive carbon black in a latex binder with a selected dispersing agent, then impregnating this carbon black dispersion into a non-woven fibrous web followed by drying any residual water, leaving a thin coating of carbon black dispersed on the surfaces of said fibers.

There is a need at the present time for a more reliable and less expensive preparative process for electroplating non-conducting surfaces than the electroless techniques. Specifically, there is a need for a better overall electroplating process for applying uniform continuous metal surfaces on the through hole walls of printed wiring boards to provide more effective electrical contact between the conducting layers of the printed wiring board.

It is a primary object of this invention to provide an improved electroplating process for non-conducting surfaces.

Another object of this invention is to provide an improved electroplating process for applying a conductive metal layer to the through hole walls of printed wiring boards.

It is still another object of this invention to provide a more economical and simplified process for applying a conductive metal layer to the surfaces of non-conducting layers of printed wiring boards than presently known electroless processes.

BRIEF DESCRIPTION OF THE INVENTION

Accordingly, the present invention accomplishes the foregoing objects by providing a process for a non-conducting material which comprises:

(a) preparing a liquid dispersion of carbon black comprised of:
  (1) carbon black particles, having an average particle diameter less than about 3.0 microns when in said dispersion;
  (2) an effective dispersing amount of a surfactant compatible with said carbon black; and
  (3) liquid dispersing medium; and, wherein the amount of carbon black is sufficient to coat substantially all of said non-conducting surface and is less than about 4% by weight of said liquid dispersion;

(b) applying said liquid dispersion to the surface of said non-conducting material; dispersing medium from carbon black (c) separating substantially all of said liquid particles, whereby said particles of carbon black are deposited on said surface in a substantially continuous layer; and (d) electroplating a substantially continuous conductive metal layer over the deposited carbon black particles and said non-conductive material.

The process of this invention is particularly useful for applying a conductive metal surface such as copper to the non-conducting portions of through hole walls of printed wiring boards. These printed wiring boards are usually composed of a non-conductive layer (e.g. epoxy resin/glass fiber mixture) positioned between two conductive metal layers (e.g. copper or nickel plates or foils) or a multiplicity of said alternating layers. Applying a conducting metal layer over said non-conducting portions of said through hole walls electrically connects the conductive metal layers. However, the process of this invention is effective for electroplating a conductive metal onto the surface of a non-conducting material of virtually any shape or surface area.

Still further, the present invention also encompasses the resulting printed wiring boards prepared by the above-noted process (i.e. those having their through hole walls coated with the carbon black deposit either alone or with the metal plating thereover).

DESCRIPTION OF THE PREFERRED EMBODIMENTS

As previously stated, one preferred embodiment of the present invention is preparing the through hole walls of a printed wiring board for the application of an electroplated layer of copper over a non-conducting layer separating two plates or foils of copper. This preparation process entails placing a selected liquid carbon black dispersion over the non-conducting portions of the through hole walls before electroplating. The liquid carbon black dispersion is a complete replacement for the electroless copper bath and all of its attendant process chemistry. That is, it replaces the preactivator step, the Pd/Sn activator, the accelerator step and the electroless bath itself. Although copper is generally used as the electroplating metal in printed wiring boards, those skilled in the art will recognize that other metals such as nickel, gold, silver and the like can also be electroplated by the process of this invention.

Printed wiring boards (also known as printed circuit boards) are generally laminated materials comprised of two or more plates or foils of copper, which are separated from each other by a layer of non-conducting material. The non-conducting layer or layers are preferably an organic material such as an epoxy resin impregnated with glass fiber particles. However, the non-conducting layer may also be comprised of thermosetting resins, thermoplastic resins, and mixtures thereof, with or without reinforcing materials such as fiberglass and fillers.

Suitable thermoplastic resins include the acetal resins; acrylics, such as methyl acrylate; cellulosic resins, such as ethyl cellulose, cellulose acetate, cellulose propionate, cellulose acetate butyrate, cellulose nitrate, and the like; chlorinated polyethers; nylon, polyethylene; polypropylene, polystyrene; styrene blends, such as acrylonitrile styrene co-polymers and acrylonitrile-butadiene-styrene (ABS) co-polymers; polycarbonates; polychlorotrifluoroethylene; and vinyl polymers and co-polymers, such as vinyl acetate, vinyl alcohol, vinyl butyral, vinyl chloride, vinyl chloride-acetate co-polymer, vinylidene chloride and vinyl formal.

Suitable thermosetting resins include alkyl phthalate, furane; melamine-formaldehyde; phenol formaldehyde and phenol-furfural co-polymer; alone or compounded with butadiene acrylonitrile co-polymer or acrylonitrile-butadiene-styrene (ABS) co-polymers; polyacrylic esters; silicones; urea formaldehydes; epoxy resins, polyimides, alkyl resins, glyceryl phthalates; polyesters; and the like.

In many printed wiring board designs, the electrical pathway or pattern requires a connection between the separated copper plates at certain points in the pattern. This is usually accomplished by drilling holes at the desired locations through the laminate of copper plates and the non-conducting layer and then connecting the separate metal plates. The hole diameters of printed wiring boards generally range from between about 0.5 and about 10 millimeters in diameter, and preferably from about 1 to about 5 millimeters.

After drilling these through holes, it may be desirable to deburr the holes to make the hole walls relatively smooth. In the case of multilayer printed wiring boards, it may also be desirable to subject the boards to a desmear or etchback operations to clean the inner copper interfacing surfaces of the through holes. Suitable preparative operations include any or all of the presently available conventional operations.

Once the surfaces of through holes have been made relatively smooth for plating, it is preferred to subject the PWB to a precleaning process in order to place the printed wiring board in condition for receiving the liquid carbon black dispersion of this invention. In one preferred pre-cleaning operation, the printed wiring board is first placed in a cleaner/conditioner bath for about 5 minutes at a temperature of about 60° C. to remove grease and other impurities from the hole wall surfaces. In this embodiment, one preferred cleaner/conditioner is principally comprised of monoethanolamine and ethylene glycol in water. A suitable cleaner/conditioner formulation is sold under the product name "Cleaner/Conditioner 102" by the Philip A. Hunt Chemical Corporation of West Paterson, N.J.

After the application of the cleaner/conditioner, the PWB is subsequently rinsed in deionized water to remove any residue cleaner/conditioner from the board. Next, it may be desirable to clean the outer copper surfaces. This may be accomplished by immersing the board in a sodium persulfate microetch solution or an aqueous sulfuric acid solution or both. A suitable persulfate microetch solution is prepared from MICROETCH 601 sold by the Philip A. Hunt Chemical Corporation of West Paterson, N.J. This solution is prepared to product contain 200 gm of sodium persulfate per liter and 0.5% by weight sulfuric acid. Neither the sodium persulfate microetch or the sulfuric acid solution is known to effect the epoxy/glass fiber surfaces or portions of the through holes of the PWB. It should be recognized that none of the above-mentioned hole drilling or precleaning operations is a critical feature of the present invention. Any and all conventional equivalents to these operations may be used instead.

The process of the present invention encompasses the preparation of a precleaned PWB for electroplating according to the following flow diagram:

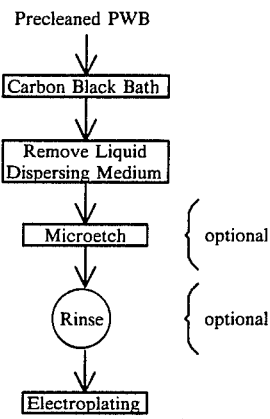

The liquid carbon black dispersion of the present invention is first applied to the cleaned PWB. This dispersion contains three critical ingredients, namely, carbon black, one or more surfactants capable of dispersing the carbon black and a liquid dispersing medium such as water. The preferred method of applying the dispersion to the PWB include immersion, spraying or other methods of applying chemicals used in the PWB industry. A single working bath is sufficient for applying this carbon black dispersion; however, more than one bath may be used for rework or other purposes.

In preparing this liquid dispersion, the three critical ingredients and any other preferred ingredients are thoroughly mixed together to form a stable dispersion. This may be accomplished by subjecting a concentrated form of the dispersion to ball milling, colloidal milling, high-shear milling or ultrasonic techniques. The thoroughly mixed dispersion is later diluted with more water while agitating to the desired concentration for the working bath. The preferred method of mixing is ball milling a concentrated form of the dispersion in a container having glass mineral or plastic beads therein for a period of about 1 to about 24 hours. This thorough mixing allows for the carbon black particles to be intimately coated or wetted with the surfactant. This mixed concentrate is then mixed with water or some other liquid dispersing medium to the desired concentration. The working bath is preferably kept agitated during both the diluting and applying steps to aid in keeping the dispersion stable.

As stated above, the carbon black particles should have an average particle diameter below about 3 microns while in the dispersion. It is desirable to have this average particle diameter of carbon black as small as possible to obtain the desired plating characteristics of substantially even plating and no plating pullaways. It is preferred that the carbon black particles have an average particle diameter from about 0.1 to about 3.0, more preferably from 0.2 and about 2.0, microns when in said dispersion. The term "average particle diameter" as employed herein in both the specification and claims refers to average mean diameter of the particles (the average by number). The average mean diameter in the dispersion may be determined through the use of either a NiComp Model 270 submicron particle sizer (Version 3.0) or a HIAC PA-720 automatic particle size analyzer (both available from the HIAC/ROYCO Instrument Division of Pacific Scientific of Menlo Park, Calif.).

All types of carbon blacks may be used for this invention including the commonly available furnace blacks.

However, it is preferred to utilize carbon blacks which are initially acidic or neutral, i.e. those which have a pH of between about 1 and about 7.5 and more preferably between about 2 and about 4 when slurried with water.

Carbon black particles of the preferred type contain between about 1 and about 10 percent by weight of volatiles and have an amorphous structure. In contrast, graphite particles used to plate through holes as mentioned in U.S. Pat. Nos. 3,099,608 and 3,163,588 are relatively pure carbon in crystalline form and have no effect on pH in an aqueous solution. When graphite particles are used as a replacement for the carbon black particles of this invention, loss of adhesion of the copper to the non-conducting material after the subsequent electroplating was noted. See Comparisons 1 and 2 below.

These preferred carbon black particles are also very porous and generally their surface areas are from between about 45 to about 1100, and preferably between about 300 and about 600, square meters per gram by the BET method (method of Brunauer-Emmett-Teller).

Illustrative carbon blacks suitable for use of this invention include Cabot XC-72R Conductive, Cabot Monarch 800, Cabot Monarch 1300, all manufactured by Cabot Corporation of Boston, MA. Other suitable carbon blacks include Columbian T-10189, Columbian Conductex 975 Conductive, Columbian CC-40-220, and Columbian Raven 3500, all available from Columbian Carbon Company of New York, NY. Monarch 800 and Raven 3500 are the two most preferred carbon blacks because of their ease of dispersion and low pH.

The term "liquid dispersing medium" as used herein in the present specification and claims includes water and polar organic solvents (both protic and aprotic). Suitable protic polar organic solvents may include lower alcohols ($C_1$-$C_4$) such as methanol, ethanol, isopropanol and isobutanol; polyhydric alcohols such as glycols (i.e. triethylene glycols); ether-alcohols such as cellosolve; organic acids, such as formic acid and acetic acid; acid derivatives such as trichloroacetic acid; and sulfonic acids such as methane sulfonic acid. Suitable aprotic polar organic solvents include aldehydes such as acetaldehyde; ketones such as acetone; aprotic aromatic solvents such as toluene and mineral spirits; aprotic halogenated hydrocarbons such as dichlorofluoromethane and dichlorodifluoromethane (FREON); dimethylformamide (DMF); dimethylsulfoxide (DMSO); and esters of carboxylic acids such as methylformate, ethylacetate and cellosolve acetate. The preferred liquid dispersing medium is water because of cost and ease of use considerations. It is preferred to utilize deionized water which is free of lime, fluorine, iodine and other impurities normally found in tap water, in order to minimize interference of foreign ions during the subsequent electroplating step.

In addition to the water and carbon black, a third critical ingredient is needed in the dispersion, namely, a surfactant capable of dispersing said carbon black in said liquid dispersing medium (i.e. compatible with said carbon black and liquid dispersing medium). One or more of these is added to the dispersion in order to enhance the wetting ability and stability of the carbon black and permit maximum penetration by the carbon black within the pores and fibers of the non-conducting layer. Suitable wetting agents include anionic, nonionic and cationic surfactants (or combinations thereof such as amphoteric surfactants). The surfactants should be soluble, stable and preferably nonfoaming in the liquid carbon black dispersion. In general, for a polar continuous phase as in water, the surfactants should preferably have a high HLB number (8–18). The preferred type of surfactant will depend mainly on the pH of the dispersion. If the total dispersion is alkaline (i.e. has an overall pH in the basic range), it is preferred to employ an anionic or nonionic surfactant. Acceptable anionic surfactants include sodium or potassium salts of naphthalene sulfonic acid such as DARVAN No. 1 (R. T. Vanderbilt Co.), ECCOWET LF (Eastern Color and Chemical), PETRO AA, PETRO ULF (Petro Chemical Co., Inc.), and AEROSOL OT (American Cyanamid). Preferred anionic surfactants include neutralized phosphate ester-type surfactants such as MAPHOS 55, 56, 8135, 60A, L6 (Mazer Chemical Co.). The most preferable anionic surfactant for a liquid carbon black dispersion is MAPHOS 56. Suitable nonionic surfactants include ethoxylated nonyl phenols such as POLY-TERGENT B-series (Olin Corporation) or alkoxylated linear alcohols such as POLY-TERGENT SL-series (Olin Corporation).

If the total dispersion is acidic, it is preferred to employ selected anionic surfactants or cationic surfactants. An acceptable group of anionic surfactants would be the sodium or potassium salts of naphthalene sulfonic acid described above. Acceptable cationic surfactants include cetyl dimethyl benzyl ammonium chloride such as AMMONYX T (Onyx Chemical Corporation); an ethanolated alkylguanidine amine complex such as AEROSOL C-61 (American Cyanamid); lipocals; dodecyldiphenyl oxide disulfonic acid (DDODA) such as DOWFAX 2A1 (Dow Chemical); a sodium salt of DDODA such as STRODEX (Dexter Chemical Corporation); and salts of complex organic phosphate esters. Preferred surfactants include amphoteric potassium salts of a complex amino acid based on fatty amines such as MAFO 13 and cationic ethoxylated soya amines such as MAZEEN S-5 or MAZTREAT (Mazer Chemical Co.). Combinations of surfactants may be employed.

The amount of carbon black in the dispersion should be less than about 4% by weight of the dispersion, preferably, less than about 2% by weight. It has been found that the use of higher concentrations of carbon blacks provide undesirable plating characteristics. In the same regard, the solids content (i.e. all of the ingredients other than the liquid dispersing medium) is preferably less than 10% by weight the dispersion, more preferably, less than about 5.6% by weight.

The three above-noted critical components of the present invention, namely, the carbon black, liquid dispersing medium and surfactant, may be employed alone to form a liquid dispersion. In some situations, it may be desirable to add other preferred ingredients to this dispersion.

One additional preferred component of the liquid carbon black-containing dispersion is a strong basic material such as an alkaline hydroxide. Suitable strong basic materials include alkali metal hydroxides such as potassium hydroxide, sodium hydroxide, and lithium hydroxide. Ammonium hydroxide or alkaline earth metal hydroxides such as calcium hydroxide may also be employed, if desired. Potassium hydroxide is the most preferred strong basic material. The term "alkaline hydroxide" is used throughout the description and claims to identify these strong basic materials. Sufficient alkaline hydroxide may be added to the liquid carbon black dispersion in a proportion sufficient to increase the pH of the resulting carbon black-containing dispersion to between about 10 and about 14, and preferably between about 10 and about 12.

The alkaline hydroxide may be added to the dispersion singly or in combination with silica. One preferred type of silica is fumed silica. One suitable fumed silica is in the form of super dense particles and is sold commercially under the trademark CAB-O-SIL MS-7SD by the Cabot Corporation. However, other fumed silica of suitable bulk density and particle size may be employed. The bulk density of suitable fumed silica is generally in the range of between about 5 to about 10, pounds per cubic foot. The desired particle size diameter of the fumed silica is generally in a range of between about 0.005 and about 0.025 and more preferably in the range of between about 0.01 and about 0.015 microns.

When employed together, the alkaline hydroxide reacts in situ with the fumed silica particles to form the corresponding soluble alkaline silicate. Excess alkaline hydroxide may be present so that the dispersion contains both the hydroxide and silicate. Lithium hydroxide and alkali earth metal hydroxides such as calcium hydroxide should not be used with silica because resulting silicates precipitate.

The porous nature of the carbon black particles enchances absorption of alkaline silicate from the liquid dispersion. As a result, there is a relatively high concentration of alkaline silicate in the pores of the carbon black particles after drying. The presence of alkaline silicate in the pores appears to enhance the conductivity of the carbon black particles during the subsequent electroplating step.

In an alternative embodiment of the present invention, the alkaline hydroxide and silica may be replaced with a mineral acid. The resulting acidic carbon black dispersion may be made up of any suitable mineral acid such as HCl, $H_2SO_4$, $H_3PO_4$ and the like. $HNO_3$ should be excluded because of its undesirable reaction with copper. Generally, a suitable concentration of acid is about 1 Normal.

Following is a typical formulation of a suitable aqueous alkaline dispersion of carbon black showing the general range of proportions as well as the preferred range of proportions for the various components:

| Component | General Range | Preferred Range |
|---|---|---|
| Carbon Black | 0.1–4% by wt. | 0.2–2% by wt. |
| Surfactant | 0.01–4% | 0.05–2% |
| Alkaline Hydroxide | 0–1% | 0.4–0.8% |
| Fumed Silica | 0–1% | 0.2–0.8% |
| Water | balance | balance |

The liquid dispersion of carbon black is typically placed in a suitable agitated vessel and the printed wiring board to be treated is immersed in, sprayed with or otherwise contacted with the liquid dispersion. The temperature of the liquid dispersion in an immersion bath is maintained in the range of between about 15° C. and about 35° C. and preferably between about 20° C. and about 30° C., while the pretreated printed wiring board is immersed therein. The period of immersion generally ranges from about 1 to about 10, and preferably from about 3 and about 5 minutes. During immersion, the liquid carbon black-containing dispersion penetrates the holes of the printed wiring board and wets and contacts the glass fiber as well as the epoxy resin which forms the components of the insulating layer. The immersed board is then removed from the bath of the liquid carbon black-containing dispersion and is then preferably contacted with compressed air to unplug any printed wiring board holes that may still retain plugs of the dispersion. In addition, excess basic liquid carbon black-containing dispersion is removed from the face of the copper plates.

The carbon black-covered board is then subjected to a step where substantially all (i.e. over about 95% by weight) of the water in the applied dispersion is removed and a dried deposit containing carbon black is left in the holes and on other exposed surfaces of the non-conducting layer. This may be accomplished by several methods such as by evaporation at room temperature, by a vacuum, or by heating the board for a short time at an elevated temperature, or by other equivalent means. Heating at an elevated temperature is the preferred method. Heating is generally carried out for between about 5 and about 45 minutes at a temperature of from about 75° C. to about 120° C., more preferably from about 80° C. to 98° C. To insure complete coverage of the hole walls, the procedure of immersing the board in the liquid carbon black dispersion and then drying may be repeated one or more times.

This drying step yields a board which may be completely coated with the carbon black dispersion. This dispersion is not only coated on the drilled hole surfaces, which is desirable, but also entirely coats the copper plate or foil surfaces which is undesirable. Thus prior to any photoimaging process all carbon black must be removed from the copper plate or foil surface.

The removal of the carbon black, specifically from the copper surfaces including, especially, the rims of the drilled holes while leaving the coating intact on the glass fibers and epoxy surface of the hole walls, may be preferably achieved by the employment of a mechanically scrubbing operation or a microetch. The microetch is preferred because of ease of use. One suitable sodium persulfate microetch is "MICRO-ETCH 601" available from Philip A. Hunt Chemical Corporation and referred to above. The mechanism by which this optional microetch works is by not attacking the carbon black material deposited on the copper foil directly, but rather to attack exclusively the first few atomic layers of copper directly below which provides the adhesion for the coating. Hence, the fully coated board is immersed in the microetch solution to "flake" off the carbon black from the copper surfaces into solution in the form of micro-flaklets. These micro-flakelets are removed from the microetch bath either by filtration through pump or via a weir type filter arrangement commonly used in the PWB industry. The liquid carbon black dispersion, the optional microetch, and the subsequent optional deionized water rinse are preferably carried out by immersing the PWB in a bath constructed of polypropylene or polyvinyl chloride (PVC) and kept agitated by a recirculation pump or pumped in air.

In the case of a multilayer type board this microetching step is especially preferred. Since, after the drying step, not only will the outer copper plate or foil be coated with carbon black but also the copper inner plates or foils exposed within the holes. Thus, this microetch procedure performs three very desirable tasks at once:

A. It removes all excess carbon black material adhering to the copper plate or foil or the faces of copper inner plates or foils in a multilayer hole.

B. It chemically cleans and microetches slightly any copper surface making it an excellent base for either dry film application or the electrolytic deposition of copper.

C. It chemically cleans the edges of the copper plate or foil around the drilled holes. This ensures no carbon black material contaminates the interface region between the electrolytically deposited copper layer of the hole wall surface and the edges of the copper outer foil.

After the optional microetch step and a subsequent water rinse, the PWB may now either proceed to the photoimaging process and later be electroplated or be directly panel electroplated.

The thus treated printed wiring board is then immersed in a suitable electroplating bath for applying a copper coating on the hole walls of the non-conducting layer.

The present invention contemplates the use of any and all electroplating operations conventionally employed in applying a metal layer to the through hole walls of a PWB. Therefore this claimed invention should not be limited to any particular electroplating bath parameters.

A typical copper electroplating bath is comprised of the following components in the following proportions:

| Component | General Proportions | Preferred Proportions |
|---|---|---|
| Copper (as metal) | 2–2.5 oz/gal | 2.25 oz/gal |
| Copper Sulfate | 8–10 oz/gal | 9 oz/gal |
| $H_2SO_4$ (by weight) | 20–30 oz/gal | 23 oz/gal |
| Chloride Ion | 20–100 mg/l | 50 mg/l |

The electroplating bath is normally agitated and preferably maintained at a temperature of between about 20° C. and about 25° C. The electroplating bath is provided with anodes, generally constructed of copper, and the printed wiring board to be plated is connected as a cathode to the electroplating circuit. For example, a current of about 15 amps per square foot is impressed across the electroplating circuit for a period of between about 60 and about 90 minutes in order to effect copper plating on the hole walls of the non-conducting layer positioned between the two plates of copper up to a thickness of about 1 mil±0.2 mil. This copper plating of the hole wall provided a current path between the copper layers of the printed wiring board. Other suitable electroplating conditions may be employed, if desired. Other electroplating bath compositions containing other copper salts or other metal salts such as salts of nickel, gold, silver and the like may be employed, if desired.

The printed wiring board is removed from the copper electroplating bath and then washed and dried to provide a board which is further processed by applying photoresist compounds and the like, as is known in the art for the preparation of printed wiring boards.

It has been found that, even with excess dwell time in the liquid carbon black bath, the resulting carbon black coating does not appreciably increase in thickness. This seems to mean that this is a surface adsorption process and once coverage is attained over the entire surface of the hole profile, no more build up of material will take place.

The process of this invention in which a copper layer is electroplated to non-conducting surfaces provides a number of unexpected advantages, including the following:

1. Application of a preactivator, Pd/Sn activator and accelerator as required by the prior art electroless copper plating procedure are eliminated.

2. Fewer procedural steps and shorter process times are needed to get a PWB ready for electroplating by the process of this invention as compared to conventional electroless processes. Also, pollution problems are much less than those of electroless processes.

3. Stability and side reaction problems related to the use of electroless plating baths are eliminated. Common trace ionic contaminants in the rinse baths have practically no effect on the liquid carbon black dispersion. Furthermore, process temperature variations appear to have no effect on it.

4. A uniform thickness of electroplated copper on the through hole walls is better achieved, and type defects or voids in the electroplated segments are minimized or eliminated. The thermal characteristics of adhesion and physical characteristics of adhesion within the hole meet, or exceed, IPC specifications.

5. The electroplated copper layer is uniformly deposited on the epoxy and glass fiber components of the non-conducting surface and there is no "pullaway" under the standard solder shock test.

6. The need for highly conductive graphite or powdered metal as used in prior art with their known disadvantages to achieve electroplating is eliminated. The porous carbon black particles of the process of this invention apparently absorb sufficient copper-containing electrolyte to achieve electrical conductance and electroplating on the surface of the non-conducting layer.

7. The carbon black coating in the through holes will not be harmed in a subsequent photoimaging process before the electroplating operation. Also, the employment of a physical scrub prior to photoimaging has no detrimental effect on the coating in the holes. Although the process of this invention is particularly suited for use in electroplating hole walls of non-conducting portions of printed wiring boards, one skilled in the art will recognize that surfaces of other non-conducting materials may be coated with a conducting metal in accordance with the process of this invention.

8. This process of this invention does not require any special copper electroplating bath chemistry or special brightener additives. It is fully compatible with all current commercial U.S. and electroplating baths, both of the matte and bright finish types.

9. The liquid carbon black bath of the present invention has a wide latitude of operable concentrations for its constituents. Also, the determination of whether the bath still contains an operable amount of these constituents may be done easily by a pH titration for basicity and a percent solids content determination. The simplicity of this bath maintenance is in direct contrast to the extensive chemical monitoring required for many of the steps of the electroless process.

The following examples are presented to define the invention more fully without any intention of being limited thereby. All parts and percentages are by weight unless otherwise explicitly specified.

Circuit Board Specifications

Several laminated circuit boards were treated by the process of this invention. Each circuit board was comprised of two 35 micron thick copper plates secured by pressing fusing to opposite sides to an epoxy resin/glass fiber layer. This epoxy resin/glass fiber layer was about 1.55 mm. thick for each board. These circuit boards were each about 20 centimeters wide and about 28 centimeters in length. There were about 50 to about 100 holes, each about 1.0 millimeters in diameter, drilled through the copper plates and epoxy resin/glass fiber layer.

EXAMPLE 1

One of these drilled circuit boards was prepared for cooper electroplating its through holes by first mechanical scrubbing the surfaces of the board and then immersing it in the following sequence of aqueous baths (each about 4.0 liters volume) for the indicated times:
1. Cleaner/Conditioner (5 minutes)
2. Rinse with Deionized Water (2 minutes)
3. Sodium Persulfate Microetch (1 minute)
4. Rinse with Deionized Water (2 minutes)
5. 10% $H_2SO_4$ (2 minutes)
6. Rinse with Deionized Water (2 minutes)
7. Carbon Black Preplating Dispersion (4 minutes) [Dry at 110° C. (10 minutes)]
8. Sodium Persulfate Microetch (1 minute)
9. Rinse with Deionized Water (1 minute)

Bath 1 was an aqueous solution containing a cleaner/conditioner formulation principally comprised of monoethanolamine and ethylene glycol in water to remove grease and other impurities from the hole wall surfaces of the boards. The bath was heated to about 60° C. to facilitate this cleaning. The cleaner/conditioner formulation is sold under the trademark Cleaner/Conditioner 102 by the Philip A. Hunt Chemical Corporation of West Paterson, N.J.

Bath 3 was a room temperature aqueous bath and contained 200 grams of sodium persulfate per liter of deionized water and 0.5% by weight of concentrated $H_2SO_4$. Its function was to microetch the copper surfaces of the board. This sodium persulfate microetch was prepared from "MICRO-ETCH 601" available from Philip A. Hunt Chemical Corporation of West Paterson, N.J.

Bath 5 was a room temperature bath of deionized water which contained 10% by weight $H_2SO_4$. The function of this bath was to remove copper oxides from the surfaces of the board.

Bath 7 is a room temperature deionized water bath containing the carbon black preplating formulation of the present invention. In this bath, the working formulations were as follows:

| | |
|---|---|
| 0.06% | by weight anionic surfactant [1] |
| 0.46% | by weight KOH [2] |
| 0.31% | by weight fumed silica [3] |
| 0.21% | by weight carbon black [4] |
| 1.04% | by weight total solids |

The balance of the bath was deionized water.
[1] MAPHOS 56 an anionic surfactant produced by Mazer Chemical Inc. of Gurnee, Illinois (90% by weight surfactant, 10% by weight $H_2O$).
[2] Solid potassium hydroxide pellets (86% by weight KOH, 14% by weight $H_2O$).
[3] CAB-O-SIL MS-7SD fumed silica produced by Cabot Corporation.
[4] RAVEN 3500 carbon black produced by Cabot Corporation.

This carbon black dispersion of bath #7 was prepared by ball milling a concentrated form of this dispersion in a jar containing stone beads so that the concentration with beads occupied about one third of the jar volume. The surfactant was dissolved in deionized water/KOH/silica to give a continuous phase. Then the carbon black was added. Milling time was six hours. After milling, the concentrate was diluted with sufficient deionized water to make the dispersion in the above-indicated proportions.

Bath 8 was the same microetch formulation as Bath 5. Its function is to microetch the copper surfaces on the board so as to remove the deposited carbon black from those surfaces. The deposited carbon black on the glass fiber/epoxy was not effected by this microetch.

Rinse baths 2, 4, 6, and 9 were employed to prevent the carryover of chemicals from one treatment bath into the next.

After treatment with this sequence of baths, the circuit board was then placed in an electroplating bath provided with agitation means and heating means and which contained an electrolyte bath comprised of the following:

| Plating Bath Compositions | |
|---|---|
| Component | Proportion |
| Copper sulfate | 8.5 oz/gal |
| $H_2SO_4$ (by weight) | 30 oz/gal |
| Chloride Ion | 24.3 mg/gl |

The circuit board was connected as a cathode in the electroplating vessel having a volume of about 4 liters. Two copper bars were immersed in the electrolyte and connected to the cell circuits as anodes. The copper bars had a length of about 8 cm; a width of about 3.2 cm and a thickness of about 0.6 cm. Each face was about 25 square cm. A direct current of 15 amps per square foot was impressed across the electrodes in the electroplating bath for approximately 85 minutes. The bath was maintained at a temperature of about 25° C. during this period and agitation was effected by air sparging. At the end of this period, the circuit board was disconnected from the electroplating circuit removed from the electrolyte, washed with deionized water and dried.

An examination of the resulting electroplated board showed that the hole walls were coated with a relatively uniform layer of copper (1.0 mil±0.2 mil) and no "dog boning" was observed (i.e. this latter effect is an undesirable condition where the plated layer is thicker near the copper laminate areas of the PWB). In a standard adhesion test [4.4], there was no removal of the electroplated copper from the hole walls of the epoxy/glass fiber layer component.
[4.4] IPC Test No. 2.6.8B "Thermal Stress Methodology Via Solder Float Test" heretofor and hereinafter referred to as the standard solder shock test.

EXAMPLES 2-8

The procedure of EXAMPLE 1 was repeated to prove the viability of the present invention with different types of carbon black besides RAVEN 3500. Carbon black preplating bath 7 was modified slightly and several different types of carbon black were tested. The working formulation of each of these baths was as follows:

| | |
|---|---|
| 0.37% | by weight MAPHOS 56 (90% in water) |
| 0.79% | by weight KOH (86% in water) |
| 0.58% | by weight CAB-O-SIL MS-7SD |
| 0.42% | by weight carbon black (see Table I) |
| 1.16% | by weight total solids |

The balance of each bath was deionized water. The most important characteristic to be tested for was adhesion of the plated on copper to hole walls.

All of the boards of EXAMPLES 2-8 showed good adhesion when tested in the standard solder shock test (IPC Test No. 2.6.8B) of the placed on copper to the epoxy/glass fiber in the through holes. An examination of the resulting electroplating boards showed that the hole walls were coated in each case with a relatively uniform layer of copper (1 mil±0.2 mil) and no "dog boning" was observed.

Some voids on about 5% to about 10% of the plating in the holes were observed on certain boards, but this is thought to be due to the slight incompatibility of the surfactant MAPHOS 56 with the particular carbon black. This slight incompatibility is believed to be due to higher pH of these particular carbon blacks as compared to the preferred Cabot Monarch 1300 and Columbian Raven 3500. The particular carbon blacks tested and their physical characteristics and the resulting voiding effects are shown in Table 1, below.

| -continued | |
|---|---|
| Carbon Black (see Table 2) | 0.42% |
| Total Solids | 1.58% by weight |

The balance of the formulation was deionized water. All of the plated boards had good adhesion when tested by the standard solder shock test. They also showed no evidence of "dog-boning" and had even copper plating. The other results of copper plating circuit boards which were pretreated with these carbon black dispersions are shown in Table 2 below. Comparing these results shown in this Table 2 with the results of Table 1 shows that the absence of $SiO_2$ in this formulation does not adversely effect the plating of through holes of circuit boards.

In a related experiment, acrylonitrile butadiene styrene (ABS) copolymer coupons were treated with a carbon black formulation similar to EXAMPLE 8 (with $SiO_2$) or EXAMPLE 15 (without $SiO_2$) and then electroplated. During the plating process, it was noted the TABLE 1
Effect of Different Carbon Blacks

| | | | | Carbon Black Characteristics in Bath [5] | | |
|---|---|---|---|---|---|---|
| Example | Type of Carbon Black | pH [6] | Average Surface Area [6] | Mean Diameter | Mean Volume [7] | Voiding Results |
| 2 | Cabot XC-72R Conductive | 7.5 | 254 | 1.5 | 3.3 | some voids |
| 3 | Cabot Monarch 800 | 8 | 210 | 1.7* | 12.0 | some voids |
| 4 | Cabot Monarch 1300 | 2.5 | 560 | 2.9* | 20.9 | no voids |
| 5 | Columbian T-10189 | 10 | N.D. | 2.1 | 4.5 | some voids |
| 6 | Columbian Conductex 975 Conductive | 7.0 | 250 | 1.6* | 6.0 | some voids |
| 7 | Columbian CC-40-220 | 5.1 | 1075 | 1.6* | 5.6 | some voids |
| 8 | Columbian Raven 3500 | 2.5 | 375 | 1.8* | 5.1 | no voids |

N.D. = Not Determined
*many submicron particles
[5] Particle size distributions were determined using a HIAC PA-720 Particle Size Analyzer with qualitative and quantitative estimation of the fraction of submicron particles. Because the number of submicron diameter particles were not measured, the actual mean particle diameter was much smaller; probably, about 0.1–0.5 microns.
[6] These pHs and average surface areas are those given in the manufacturer's specifications.
[7] Mean Volume is calculated from mean diameter according to a procedure provided by HIAC/ROYCO.

EXAMPLES 9-15

The procedure of EXAMPLE 1 was repeated to show the viability of the present invention without the inclusion of silica in the carbon black dispersions. The carbon black preplating bath #7 of EXAMPLES 2-8 were made up without silica and therefore had the following percentages of constituents in each dispersion:

| MAPHOS 56 (90% in water) | 0.37% by weight |
|---|---|
| KOH (86% in water) | 0.79% | formulation similar to EXAMPLE 8 (with $SiO_2$) plated about twice as fast as the formulation of EXAMPLE 15. Both had good plating adhesion when tested by the standard tape pull test (IPC Test No. 2.4.1).

TABLE 2
Effect of $SiO_2$ Absence

| | | | | Carbon Black Characteristics in Bath [5] | | |
|---|---|---|---|---|---|---|
| Example | Type of Carbon Black | pH [6] | Average Surface Area [6] | Mean Diameter | Mean Volume [7] | Voiding Results |
| 9 | Cabot XC-72R Conductive | 7.5 | 254 | 1.7 | 16.4 | some voids |
| 10 | Cabot Monarch 800 | 8 | 210 | 2.4 | 19.0 | some voids |
| 11 | Cabot Monarch 1300 | 2.5 | 560 | 2.7 | 20.6 | no voids |
| 12 | Columbian T-10189 | 10 | N.D. | 2.1 | 9.1 | some voids |
| 13 | Columbian Conductex 975 Conductive | 7.0 | 250 | 1.8 | 16.4 | some voids |
| 14 | Columbian CC-40-220 | 5.1 | 1075 | 2.0 | 17.0 | some voids |
| 15 | Columbian Raven 3500 | 2.5 | 375 | 1.9 | 7.1 | no voids |

N.D. = Not Determined
[5] Particle size distributions were determined using a HIAC PA-720 Particle Size Analyzer with qualitative and quantitative estimation of the fraction of submicron particles. Because the number of submicron diameter particles were not measured, the actual mean particle diameter was much smaller; probably, about 0.1–0.5 microns.
[6] These pHs and average surface areas are those given in the manufacturer's specifications.
[7] Mean Volume is calculated from mean diameter according to a procedure provided by HIAC/ROYCO.

EXAMPLES 16-19

The procedure of EXAMPLE 1 was again repeated to show the viability of the present invention without the inclusion of silica and employing varying amounts of the KOH in the carbon black dispersion. Thus, the carbon black preplating dispersion bath #7 had the following percentages of each constituent as given below:

|  | 16 | 17 | 18 | 19 |
|---|---|---|---|---|
| MAPHOS 56 (90% basis) | 0.37% | 0.37% | 0.37% | 0.37% |
| KOH (86% basis) | 0.36% | 0.18% | 0.09% | 0 |
| RAVEN 3500 | 0.42% | 0.42% | 0.42% | 0.42% |
| Total Solids | 1.15% | 0.97% | 0.88% | 0.79% |

Table III shows the resulting pH and dispersion characteristics. The dispersion was poor for EXAMPLE 19 (zero concentration) because the MAPHOS 56 surfactant was not stable in that acid media and therefore was not effective in dispersing the acidic RAVEN 3500. The best dispersion characteristics were observed when the resulting dispersion had a higher pH. All of these experiments except EXAMPLE 19 showed good uniform plating (1 mil±0.2 mil) with only some amount of voids (about 5% to about 10% of the holes in the boards showed voids) and good adhesion when subjected to the standard solder shock test.

TABLE 3

Effect of Different Concentrations of KOH Wothout SiO$_2$

| Example | Concentration of KOH % | pH of a Concentrate [8] | Mean Diameter [5] | Mean Volume | Voiding Characteristics |
|---|---|---|---|---|---|
| 16 | 0.36 | 11.2 | 2.5 microns | 22.8 microns | some voiding |
| 17 | 0.18 | 10.08 | 1.8 microns | 6.1 microns | some voiding |
| 18 | 0.09 | 7.95 | 2.2 microns | 10.3 microns | some voiding |
| 19 | 0 | 4.48 | — | — | some voiding |

[5] Particle size distributions were determined using a HIAC PA-720 Particle Size Analyzer with qualitative and quantitative estimation of the fraction of submicron particles. Because the number of submicron diameter particles were not measured, the actual mean particle diameter was much smaller; probably, about 0.1–0.5 microns.
[8] This pH value was determined by taking a pH of a concentrate of the dispersion before diluting with more deionized water (11:1).

EXAMpLES 20-25

The procedure of EXAMPLE 1 was again repeated to show the viability of the present invention without the inclusion of either the silica or KOH in the carbon black preplating dispersion. Instead, an acidic carbon black preplating dispersion bath #7 was employed. The percentages of selected surfactant and carbon black in each dispersion was each 2.5% by weight. Before making up the dispersion, the deionized water that is the balance of the formulations, was acidified with HCl to make 1.0 normal solution. The particular carbon blacks and surfactants employed are shown in Table 4 along with their dispersion and voiding characteristics.

As can be seen from Table 4, the voiding characteristics were minor voids for EXAMPLE 20, EXAMPLE 23 and EXAMPLE 25 (only about 1–2% of the holes were voided). All EXAMPLES showed good adhesion in the standard solder shock test.

EXAMPLE 26

Use of a Commercial Pattern Plating Line

Both multilayer and two side copper epoxy/glass fiber circuit boards were treated on a commercial line by the process of this invention. At least 50 holes, each about 1.0 millimeter in diameter, were drilled and deburred through the copper plates and epoxy resin/glass fiber layer or layers.

These drilled and deburred circuit boards were prepared for imaging and copper electroplating by first mechanical scrubbing the surfaces of each board and then immersing them in the following sequence of aqueous baths for the indicated times:

| Bath 1. | Cleaner/Conditioner Solution | (4 min.) |
|---|---|---|
| Bath 2. | Rinse | (2 min.) |
| Bath 3. | Sodium Persulfate Microetch | (1 min.) |
| Bath 4. | Rinse | (2 min.) |
| Bath 5. | 10% H$_2$SO$_4$ Solution | (2 min.) |
| Bath 6. | Rinse | (2 min.) |
| Bath 7. | Carbon Black Preplating Dispersion | (4 min.) |

[Drying at 185–190° C. for 10 min.]

| Bath 8. | Sodium Persulfate Microetch | (2 min.) |
|---|---|---|
| Bath 9. | Rinse | (2 min.) |

Bath 1 was an aqueous solution containing a cleaner/conditioner formulation principally comprised of monoethanolamine and ethylene glycol in water to remove grease and other impurities from the hole wall surfaces of the boards. The bath was heated to about 148° F. to facilitate this cleaning. The cleaner/conditioner formulation is sold under the trademark Cleaner/Conditioner 102 by the Philip A. Hunt Chemical Corporation of West Paterson, N.J.

Bath 3 was a room temperature aqueous bath and contained 200 grams of sodium persulfate per liter of deionized water in addition to 0.5% by weight of concentrated H$_2$SO$_4$. Its function was to microetch the copper surfaces of the board. The microetch was MICRO-ETCH 601 available from Philip A. Hunt Chemical Corporation.

TABLE 4

EFFECTS OF HCl

| Example | Carbon Black | Surfactant | Mean Diameter [5] microns | Mean Volume microns | Voiding Characteristics |
|---|---|---|---|---|---|
| 20 | Raven 3500 | Petro AA | N.T. | N.T. | minor voids |
| 21 | Monarch 800 | Petro AA | N.T. | N.T. | some voids |
| 22 | T-10189 | Petro AA | N.T. | N.T. | some voids |
| 23 | Raven 3500 | MAFO 13 | 1.9 | 17.9 | minor voids |
| 24 | Raven 3500 | MAZTREAT | N.T. | N.T. | some voids |
| 25 | Raven 3500 | MAZEEN S-5 | 2.0 | 14.2 | minor voids |

N.T. = Not Tested
[5] Particle size distributions were determined using a HIAC PA-720 Particle Size Analyzer with qualitative and quantitative estimation of the fraction of submicron particles. Because the number of submicron diameter particles were not measured, the actual mean particle diameter was much smaller; probably, about 0.1–0.5 microns.

Bath 5 was a room temperature bath of deionized water which contained 10% by weight H₂SO₄. The function of this bath was to remove copper oxides from the surfaces of the board.

Bath 7 is a room temperature deionized water bath containing the carbon black preplating formulation of the present invention. In this bath, the working formulations were as follows:

| |
|---|
| 0.06% by weight anionic surfactant [1] |
| 0.46% by weight potassium hydroxide [2] |
| 0.31% by weight fumed silica [3] |
| 0.21% by weight carbon black [4] |
| 1.32% by weight total solids |

The balance of the bath was deionized water.
[1] MAPHOS 56 an anionic surfactant produced by Mazer Chemical Inc. of Gurnee, Illinois (90% by weight surfactant, 10% by weight H₂O).
[2] Solid potassium hydroxide pellets (86% by weight KOH, 14% by weight H₂O).
[3] CAB-O-SIL MS-7SD fumed silica produced by Cabot Corporation.
[4] RAVEN 3500 carbon black produced by Cabot Corporation.

The balance of the bath was deionized water.

Bath 8 was the same microetch formulation as Bath 3. Its function is to microetch the copper surfaces of the board so as to remove the deposited carbon black from those surfaces.

Rinse baths 2, 4, 6, and 9 were employed to prevent the carryover of chemicals from one treatment bath to the next.

After treatment with the sequence of baths, the treated circuit boards were then mechanically scrubbed and placed in an imaging process followed by a copper electroplating process.

An examination of the resulting electroplated boards showed that hole walls were coated with a relatively uniform layer of copper (i.e. about 1 mil±0.2 mil) and no "dog-boning" was observed. In a standard solder shock test, there was good adhesion (i.e. no pullaways) of the electroplated copper from the hole walls of the epoxy/glass fiber layer component. These plated circuit boards also passed IPC Test 2.4.21 "Terminal Bond Strength" and 2 MIL Specification S5110C "Extended Thermal Shock Test and Thermal Cycle Test" as described in IPC-TR-578.

COMPARISONS 1 AND 2

The procedure of EXAMPLE 1 was repeated again except that the carbon black preplating bath 7 was modified to contain graphite. Two graphite formulations were prepared as follows:

| COMPARISON 1 |
|---|
| 5.6% by weight KOH (86%) |
| 3.7% by weight CAB-O-SIL MS-7SD |
| 2.5% by weight MAPHOS 56 (90%) |
| 2.5% by weight graphite |
| 14.3% by weight total solids |

| COMPARISON 2 |
|---|
| 1.1% by weight KOH (86%) |
| 0.7% by weight CAB-O-SIL MS-7SD |
| 0.5% by weight MAPHOS 56 (90%) |
| 0.5% by weight graphite |
| 2.3% by weight total solids |

The balance of each formulation was deionized water. The mean particle size of the solids was measured by a HIAC particle sizer and found to be 3.1 microns diameter and 10.7 mean volume in the case of both formulations.

After plating, the through holes in the circuit boards were inspected for flaws. The boards which were subjected to the preplating operation with the formulation of COMPARISON 1 had only a few visible voids, but failed the solder shock test. The plated on copper in the holes pulled away from the epoxy/glass fiber layer. A visible layer of dried graphite dispersion was observed between the epoxy/glass fiber layer and the pulled away copper plate. The thick layer was believed to be the cause of lack of adhesion of the copper. The boards which were subjected to the formulation of COMPARISON 2 had no or very few unvoided holes. The standard shock test could not be run with this latter graphite formulation because of the lack of unvoided holes. In all, both graphite formulations were far inferior for copper electroplating preparation as compared to the above carbon black formulations of the preceding EXAMPLES.

What is claimed is:

1. A process for electroplating a conductive metal layer to the surface of a non-conductive material which comprises:

(a) preparing a liquid dispersion of carbon black comprised of:

(1) carbon black particles having an average particle diameter of less than about 3.0 microns in said dispersion;

(2) an effective dispersing amount of a surfactant which is compatible with said carbon black; and (3) liquid dispersing medium, wherein the amount of carbon black is sufficient to coat substantially all of said non-conducting surfaces and is less than about 4% by weight of said liquid dispersion;

(b) applying said liquid dispersion to the surface of the non-conducting material;

(c) separating substantially all of said liquid dispersing medium from said carbon black particles, whereby said particles are deposited on said non-conductive surface in a substantially continuous layer; and (d) electroplating a substantially continuous conductive metal layer over the deposited carbon black layer and said non-conductive surface.

2. The process of claim 1 wherein said liquid dispersion further comprises a sufficient amount of at least one alkaline hydroxide dto raise the pH of said liquid dispersion in the range from about 10 to 14.

3. The process of claim 2 wherein said alkaline hydroxide is selected from the group consisting of potassium hydroxide, sodium hydroxide, and ammonium hydroxide.

4. The process of claim 2 wherein said liquid dispersion further comprises an alkaline silicate, which is formed by the reaction of fumed silica particles and said alkaline hydroxide.

5. The process of claim 1 wherein said liquid dispersing medium is water.

6. The process of claim 1 wherein said liquid dispersion contains less than about 10% by weight solids constituents.

7. The process of claim 1 wherein said carbon black particles have an initial pH from about 2 to about 4.

8. The process of claim 1 wherein said surfactant is a phosphate ester anionic surfactant.

9. The process of claim 1 wherein said conductive metal is selected from the group consisting of copper, nickel, gold and silver.

10. The process of claim 9 wherein said conductive metal is copper.

11. The process of claim 1 wherein said applying step (b) is carried out by immersing the non-conductive material into said liquid dispersion.

12. The process of claim 1 wherein said separating step (c) is carried out by heating the deposited dispersion.

13. The process for electroplating the walls of through holes in a laminated printed wiring board comprised of at least one non-conducting layer laminated to at least two separate conductive metal layers, which comprises the steps:
 (a) applying said printed wiring board having said through holes in a bath of a liquid dispersion of carbon black comprised of:
  (1) carbon black particles having an average particle size of less than about 3.0 microns in said dispersion;
  (2) an effective dispersing amount of a surfactant which is compatible with said carbon black; and
  (3) a liquid dispersing medium, wherein the amount of carbon black is sufficient to coat substantially all of said non-conducting surfaces and is less than about 4% by weight of said liquid dispersion;
 (b) separating substantially all of the liquid dispersing medium from said dispersion, thereby depositing said carbon black particles in a substantially continuous layer on said non-conducting portions of said hole walls; and
 (c) electroplating a substantially continuous metal layer over the deposited carbon black layer on said non-conducting portions of hole walls, thereby electrically connecting said metal layers of said printed wiring board.

14. The process of claim 13 wherein said liquid dispersion further comprises a sufficient amount of at least one alkaline hydroxide to raise the pH of said liquid dispersion in the range from about 10 to 14.

15. The process of claim 14 wherein said liquid dispersion further comprises an alkaline silicate, which is formed by the reaction of fumed silica particles and said alkaline hydroxide.

16. The process of claim 15 wherein said liquid dispersion contains less than about 10% by weight solids constituents.

17. The process of claim 13 wherein said carbon black particles have an initial pH from about 2 to about 4.

18. The process of claim 13 wherein said surfactant is a phosphate ester anionic surfactant.

19. The process of claim 13 wherein said conductive metal is copper.

20. The process of claim 13 wherein said liquid dispersing medium is water.

21. The process of claim 13 wherein said process further comprises microetching said metal layers of said printed wiring board after step (b) and before step (c) to remove any deposited carbon black therefrom.

22. The process of claim 21 wherein said process further comprises a water rinse after said microetching.

* * * * *